United States Patent
Keating et al.

(10) Patent No.: US 6,856,517 B2
(45) Date of Patent: Feb. 15, 2005

(54) EMISSION COMPLIANT DEVICE ENCLOSURE WITH INTERCHANGEABLE BEZEL

(75) Inventors: Virginia W. Keating, Encinitas, CA (US); Juan L. Ortiz, San Diego, CA (US); Mark A. Zisek, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/896,396

(22) Filed: Jun. 29, 2001

(65) Prior Publication Data

US 2003/0002269 A1 Jan. 2, 2003

(51) Int. Cl.[7] .............................. H05K 7/14; H05K 7/18
(52) U.S. Cl. ....................... 361/796; 361/732; 361/759; 361/800; 361/801; 361/802; 361/816; 361/818; 174/35 R
(58) Field of Search .................... 361/796, 752–753, 361/825, 818, 800–802, 806, 679, 683, 724, 725, 726, 728–732, 803, 690, 814, 816, 759, 747, 685; 312/223.1, 223.2, 265.6; 174/35 R, 35 TS

(56) References Cited

U.S. PATENT DOCUMENTS

| | | | | |
|---|---|---|---|---|
| 5,045,973 A | * | 9/1991 | Saarela et al. ............... 361/814 |
| 5,047,898 A | * | 9/1991 | Cooke et al. .......... 174/35 GC |
| 5,162,980 A | * | 11/1992 | Morgan et al. ............. 361/424 |
| 5,336,849 A | * | 8/1994 | Whitney ....................... 174/48 |
| 5,397,176 A | * | 3/1995 | Allen et al. ............... 312/223.2 |
| 5,417,012 A | * | 5/1995 | Brightman et al. ....... 312/223.2 |
| 5,473,507 A | * | 12/1995 | Schwegler et al. ......... 361/690 |
| 5,568,611 A | * | 10/1996 | Khatri et al. ............. 312/223.2 |
| 5,682,289 A | * | 10/1997 | Schwegler et al. ......... 361/679 |
| 5,729,441 A | * | 3/1998 | Murakami ................... 361/818 |
| 5,774,337 A | * | 6/1998 | Lee et al. .................... 361/725 |
| 5,783,771 A | * | 7/1998 | Copeland et al. .......... 174/35 R |
| 5,825,634 A | * | 10/1998 | Moorehead, Jr. ........... 361/816 |
| 6,018,125 A | * | 1/2000 | Collins et al. ............. 174/35 R |
| 6,181,575 B1 | * | 1/2001 | Yang .......................... 361/816 |
| 6,185,097 B1 | * | 2/2001 | Behl .......................... 361/695 |
| 6,242,691 B1 | * | 6/2001 | Reese et al. .............. 174/35 R |
| 6,354,680 B1 | * | 3/2002 | Lin et al. ...................... 292/87 |
| 6,362,416 B1 | * | 3/2002 | Denny et al. ............. 174/35 R |
| 6,373,697 B1 | * | 4/2002 | Lajara et al. ................ 165/122 |

* cited by examiner

Primary Examiner—Amir Zarabian
Assistant Examiner—Thanh Y. Tran
(74) Attorney, Agent, or Firm—Blakely, Sokoloff, Taylor & Zafman LLP

(57) ABSTRACT

A sub-bezel coupled to an electronic device to block electronic emissions and allow for a bezel to be interchangeable. Because the bezel is not needed to block electronic emissions to allow the device to pass through regulatory testing, the bezel can be designed and added after regulatory testing without the electronic device having to be sent back through regulatory testing. Being able to interchange the bezel allows companies to lower projection risks. If a customer projection for a electronic device is too high because the customer does not buy as many electronic devices as expected, the bezel can be changed and the excess electronic devices can be sold to a different customer without having to send all the changed electronic devices back through regulatory testing.

13 Claims, 6 Drawing Sheets

EMISSION COMPLIANT DEVICE ENCLOSURE WITH INTERCHANGEABLE BEZEL

FIELD OF THE INVENTION

The present invention relates to device enclosures and in particular, interchangeable bezels for device enclosures.

BACKGROUND OF THE RELATED ART

Electronic devices may give off electronic emissions that can interfere with neighboring electronic devices. Regulatory testing is usually required for the electronic devices to insure that the electronic devices are not giving off electronic emissions above a certain level. The electronic devices are usually enclosed by an enclosure and a bezel on the front of the enclosure to contain the electronic device's electronic emissions and block out the electronic emissions from external sources. Usually, the bezels have different customer preferred designs on them depending on the customer buying the specific electronic device that the bezel will be coupled to. Once coupled to the enclosure of the electronic device, the bezel is usually hard to change. A company wanting to change the bezel must take the bezel off, attach a new bezel to the electronic device, and then send the electronic device with the new bezel back through regulatory testing. This process can make changing the bezel very expensive.

In addition, the companies making the electronic devices for the customers must predict how many of each electronic device the company can sell to each customer and then build the appropriate number of electronic devices with each customer's preferred bezel design. If a customer buys fewer than the amount predicted for them, left over electronic devices are not easily sold to other customers. The left over electronic devices must be modified by removing the bezel, putting on the new bezel with the new customer's design, and then retested.

Other devices that give off electronic emissions and must be tested face similar problems. These devices include but are not limited to set top boxes. Any changes to the bezel of the device may allow more electronic emissions to escape and therefore the device may need to be retested.

DETAILED DESCRIPTION OF THE INVENTION

The following description makes reference to numerous specific details in order to provide a thorough understanding of the present invention. However, it is to be noted that not every specific detail need be employed to practice the present invention. Additionally, well-known details, such as particular materials or methods, have not been described in order to avoid obscuring the present invention.

Figure 1A:
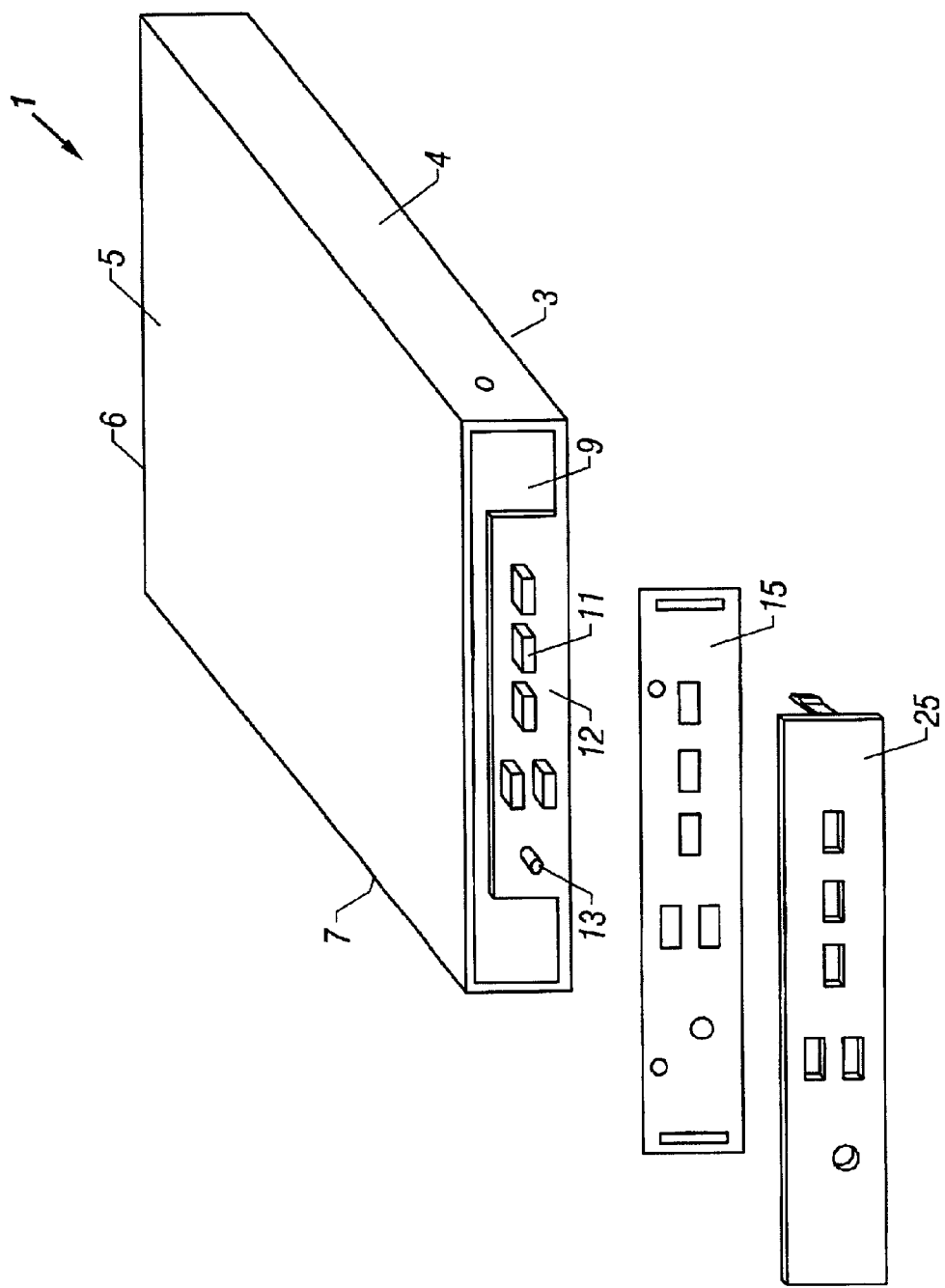
FIG. 1a shows an embodiment with a detached sub-bezel and bezel.

Referring to FIG. 1a, an electronic system 1, such as a network appliance, is shown. The electronic system 1 shown has an electronic device with an enclosure with side panels 4, 7, back panel 6, top panel 5, and bottom panel 3 that at least partially surrounds the electronic device. The enclosure may be made of several different materials including but not limited to steel and aluminum alloys. The enclosure material may be processed in several different ways. For example, the enclosure may be steel electro-galvanized G30, smooth tempered, and semi-bright to bright finish. The panels for the enclosure may be manufactured in several different ways including but not limited to stamp pressing. The side panels 4, 7 and back panel 6 may be stamped pressed separately from the bottom panel 3 and then welded onto the bottom panel 3 and each other to form an enclosure, or the side panels 4, 7, the back panel 6, and the bottom panel 3 may be stamped pressed as a single piece and then the side panels 4, 7 and back panel 6 can be folded up from the bottom panel 3 and then welded on their sides to form an enclosure. Besides welding the panels, such as bottom panel 3, side panels 4, 7, and back panel 6, panels may be coupled to each other using parts such as but not limited to interlocking parts, snaps, and screws.

The enclosure may serve several different purposes. For example, the enclosure may keep together and secure internal parts of the electronic device. The enclosure can also serve to block out the electronic emissions coming out of or going into the electronic device. However, the enclosure may not stop the electronic emissions from going into or out of front opening 9. As seen in FIG. 1a, the front opening 9 may allow the electronic emissions to escape from inside electronic device. Also, the electronic emissions from other electronic devices may enter the electronic device through the front opening 9 and possibly disrupt operations inside the electronic device.

The electronic device also may have a component securing panel 12 which may be attached to the electronic device. The electronic device components such as button 11 and light emitting diode (LED) 13 may be any electronic device component on the electronic device such as but not limited to dials, buttons, electronic displays, connectors, and lights or LEDs. The component securing panel 12 may not be wide enough to cover the front opening 9. In addition, component securing panel 12 may not be attached to the electronic device and may need a front panel to secure to. Also shown is a detached sub-bezel 15 and bezel 25.

Figure 1B:
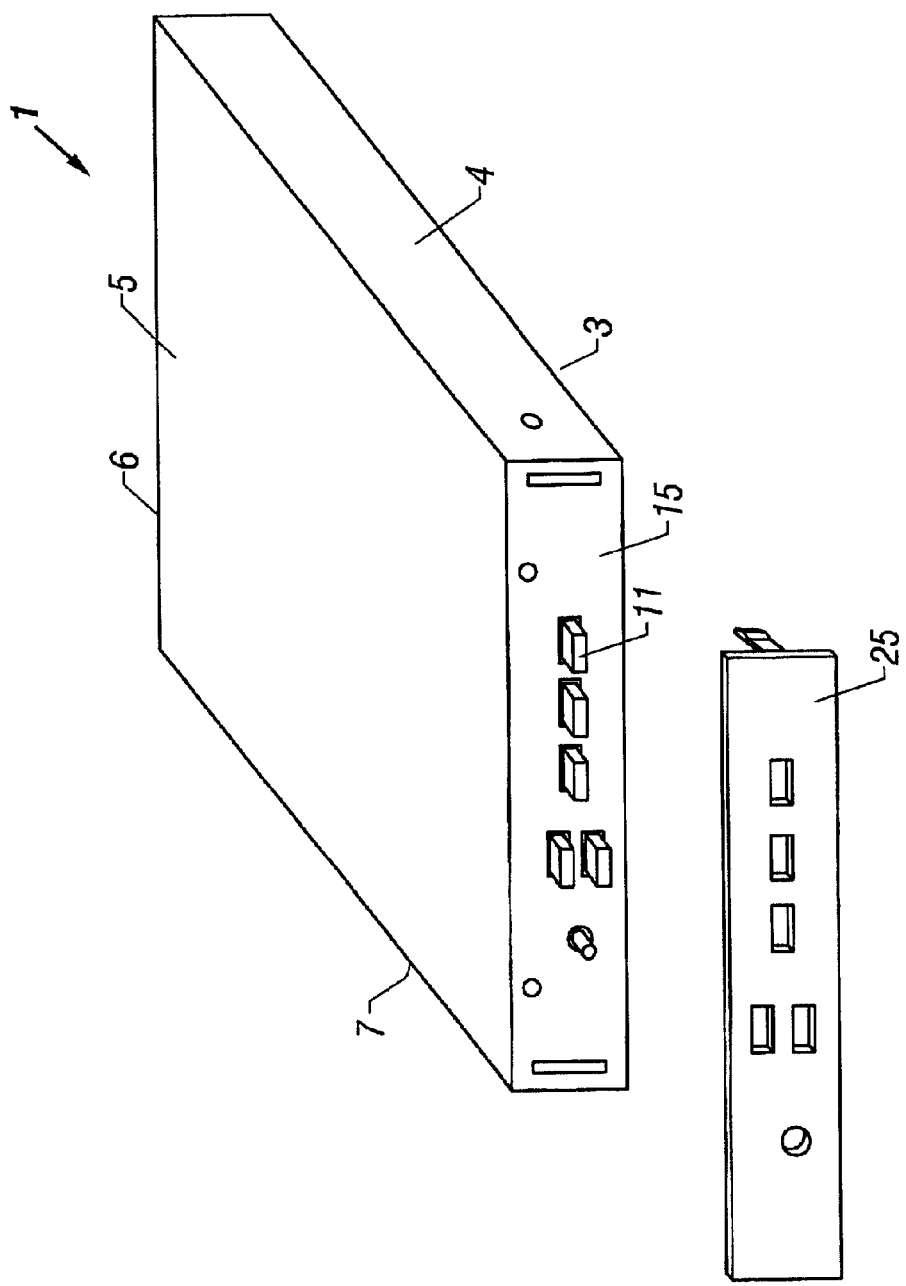
FIG. 1b shows an embodiment with a coupled sub-bezel and a detached bezel.

Referring to FIG. 1b, an embodiment of the invention with a single piece forming the sub-bezel 15, side-panels 4, 7, back panel 6, and bottom panel 3 is shown. The side panels 4, 7, back panel 6, and sub-bezel 15 can be folded up from the bottom panel 3 and welded together at their sides to form an enclosure. Other methods of coupling the sides such as interlocking parts and screws are also within the scope of the invention. The electronic device components may be secured by the sub-bezel 15 without a component securing panel 12 (as seen in FIG. 1a). In another embodiment, the sub-bezel 15, bottom panel 3, and back panel 6 may be stamp pressed as one piece and then sub-bezel 15 and back panel 6 may be folded up. The sub-bezel 15, bottom panel 3, and back panel 6 piece may then be coupled to side panel 7, top panel 5, and side panel 4 which may be stamp pressed as one piece and then side panels 4 and 7 folded from top panel 5.

Figure 2:
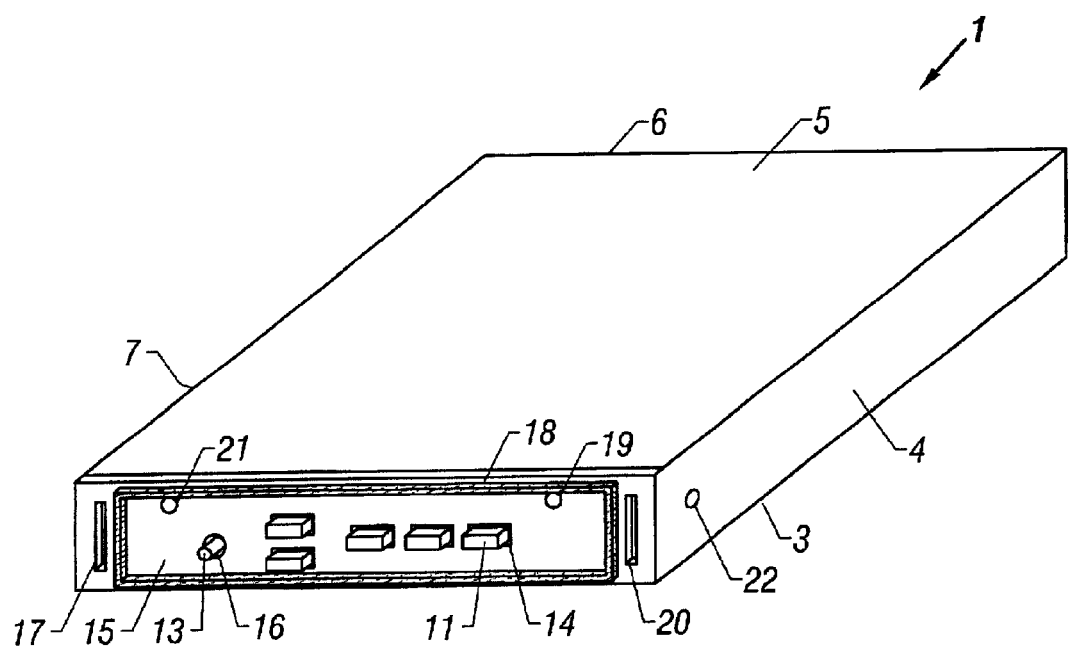
FIG. 2 shows an embodiment with a flange and a sub-bezel.

Referring to FIG. 2, an embodiment of the invention is shown as an electronic system 1 with an electronic device secured inside the side panels 4, 7, the top panel 5, the bottom panel 3, and the back panel 6 of the enclosure. Furthermore, sub-bezel 15 may be coupled to the front of the electronic device to secure component securing panel 12 (view obscured in FIG. 2) and shield a substantial portion of the electronic emissions from entering or leaving the front opening. However, the sub-bezel 15 may secure the electronic device components without a component securing panel. The electronic device components, such as the button 11 and the LED 13 may stick out through sub-bezel holes 14 and 16, respectively, in order to be accessible. The sub-bezel 15 may be made of several different materials including but not limited to steel and aluminum alloys. The sub-bezel 15 material may be processed in several different ways. For example, the sub-bezel 15 may be steel electro-galvanized G30, smooth tempered, and semi-bright to bright finish. The sub-bezel 15 may be manufactured in several different ways including but not limited to stamp pressing. The sub-bezel 15 may be attached to the enclosure in several different ways to shield a substantial portion of electronic emissions entering and leaving the electronic device. For example, the sub-bezel 15 may be formed as a single piece with the bottom panel 3 and then folded up along the sub-bezel's bottom edge. The sides of the sub-bezel 15 may then be coupled to the side panels 4, 7. In another embodiment, the sub-bezel 15 may be formed separately and then be welded, brazed, or screwed onto the enclosure. The sub-bezel 15 may also be coupled to the enclosure by fasteners such as but not limited to adhesive, screws, rivets, or a friction fit. Other ways of coupling the sub-bezel 15 are also within the scope of the invention. Alternately, the sub-bezel 15 may not be coupled to the enclosure.

Continuing with FIG. 2, a flange 18 is shown as a lip extending outward from sub-bezel 15. In another embodiment, the flange 18 may be an extension of the side, top, and bottom panels in the form of a lip extending outward from the enclosure. The flange 18 may be used to block light from entering the electronic device if the electronic device is further coupled to a bezel, such as bezel 25 shown in FIG. 3.

Figure 3:
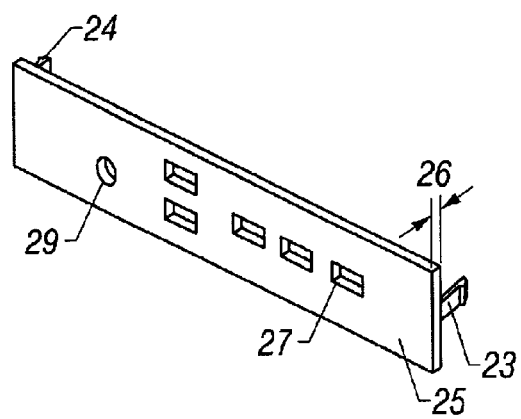
FIG. 3 shows a bezel that may be used with an embodiment.

Also seen in FIG. 2, the sub-bezel 15 may have front slots 17 and 20. The front slots 17 and 20 may be used in conjunction with side slots on the enclosure such as side slot 22 for bezel snaps 23 and 24 (as shown in FIG. 3) to snap and un-snap. Slots in the sub-bezel 15 and the enclosure such as the front slots 17 and 20 and the side slot 22 may be small enough to keep the electronic emissions to a minimum. If not small enough to sufficiently block the electronic emissions, the slots may also be shielded.

Figure 4:
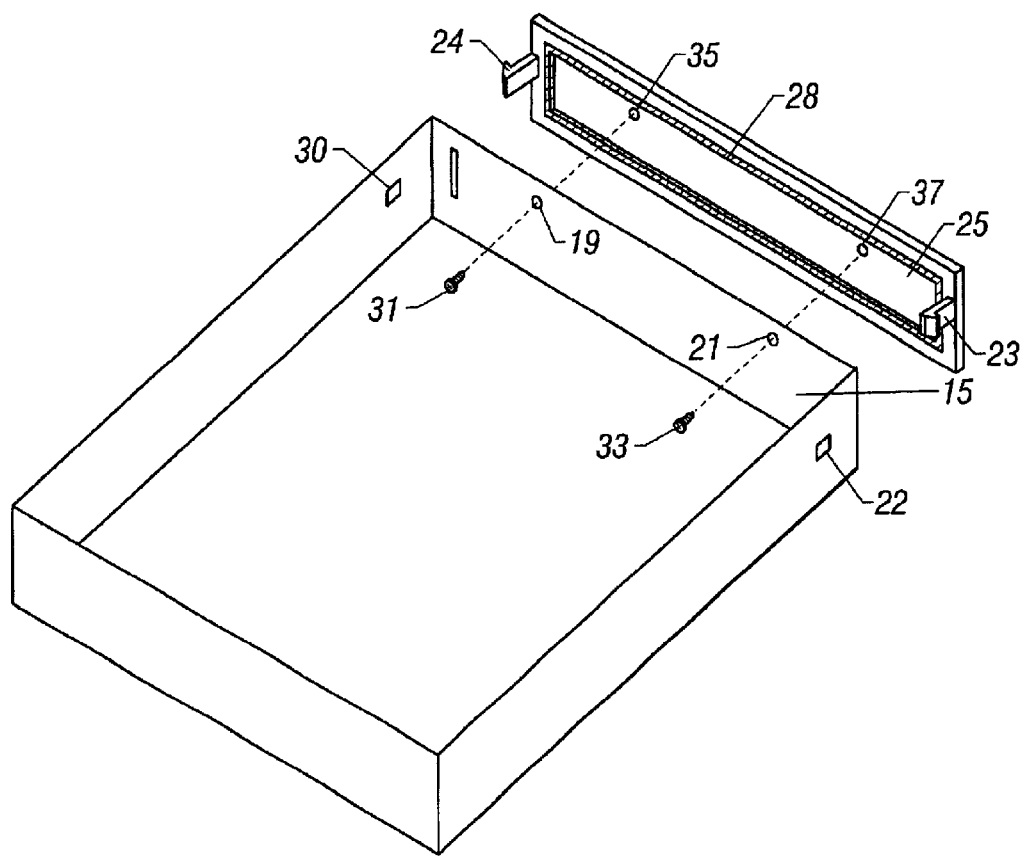
FIG. 4 shows a reverse view of an embodiment with a bezel and without a top panel.

Continuing with FIG. 2, the sub-bezel 15 may have clearance holes 19 and 21 for fasteners such as self-locking screws 31 and 33 as seen in FIG. 4. The self-locking screws 31 and 33 may be used to secure bezel 25 to the front of the electronic device (as seen in FIG. 4). The self-locking screws 31 and 33 may be needed in addition to bezel snaps 23 and 24 to hold bezel 25 in place and prevent theft of bezel 25 (as seen in FIG. 4).

As seen in FIG. 2, with sub-bezel 15 in place, a substantial portion of the electronic emissions may be shielded from entering or leaving the electronic device. In addition, the electronic device should be protected from external electronic emissions that may affect the electronic device's operation. With the sub-bezel 15 in place, the electronic device should pass regulatory testing to be in compliance with applicable emission regulations before bezel 25 (as seen in FIG. 3) is coupled to the electronic device. Bezel 25 may be coupled to the enclosure by fasteners such as but not limited to snaps, screws, and adhesive. Bezel 25 may also be coupled to the sub-bezel 15 by a fastener such as but not limited to snaps, screws, rivets, and adhesive.

Referring to FIG. 3, bezel 25 is shown with the side snaps 23 and 24 and bezel holes 27 and 29. Bezel 25 may be made of materials such as but not limited to plastic, steel, and aluminum alloys. For example, bezel 25 may be made of ABS plastic, which may be flame retardant with a flammability rating of 94-Z0. In addition, bezel 25 can be manufactured using several different processes such as but not limited to vacuum molded processing, extrusion, injection die molding, and stamp pressing. Bezel thickness 26 may vary depending on the electronic device, but should be small enough that the electronic device components, such as the button 11 and the LED 13 seen in FIG. 2, can be accessed through the bezel holes 27 and 29. If the bezel thickness 26 is too great, the end of the electronic device components, such as the button 11, may not extend past the front of bezel 25. If the electronic device components do not extend past the front of bezel 25, they may be hard to access or read. The bezel thickness 26 may be greater away from the electronic device components, such as the button 11. For example, the ends of the bezel 25 may be designed thicker than the rest of the bezel 25. Because the sub-bezel 15 (as seen in FIG. 2) may shield a substantial portion of the electronic emissions entering or leaving the electronic device, the bezel 25 does not have to be designed to shield against emissions.

Referring to FIG. 4, a reverse view of an embodiment of the invention is shown. The self-locking screws 31 and 33 may pass through the clearance holes 19 and 21 in the sub-bezel 15 and screw into and terminate in bezel 25 at screw holes 35 and 37 to hold bezel 25. The screws 31 and 33 may serve to hold bezel 25 secure against the sub-bezel 15 and may deter theft of bezel 25. To remove bezel 25, the top panel 5 (seen in FIG. 2) may be removed before the screws 31 and 33 are removed. Then bezel 25 may be removed by undoing the bezel's fasteners, for example, the side snaps 23 and 24 from the side slots 22 and 30 respectively.

Also as seen in FIG. 4, flange slot 28 is shown on bezel 25. Flange slot 28 may fit over flange 18 (as seen in FIG. 2). In another embodiment, the flange 18 may extend over the sub-bezel 15 and at least partially fit inside the flange slot 28 when bezel 25 is coupled to the electronic device. In another embodiment of the invention, there may be no flange slot 28, but instead, the flange 18 may fit against bezel 25. In another embodiment, the flange 18 may be on the bezel 25 and the flange slot 28 may be on the sub-bezel 15. The flange 18 may block external light from leaking into the front of the electronic device or leaking onto the sub-bezel 15. Light shining on the electronic device or the sub-bezel 15 may degrade the appearance of the electronic device.

Figure 5:
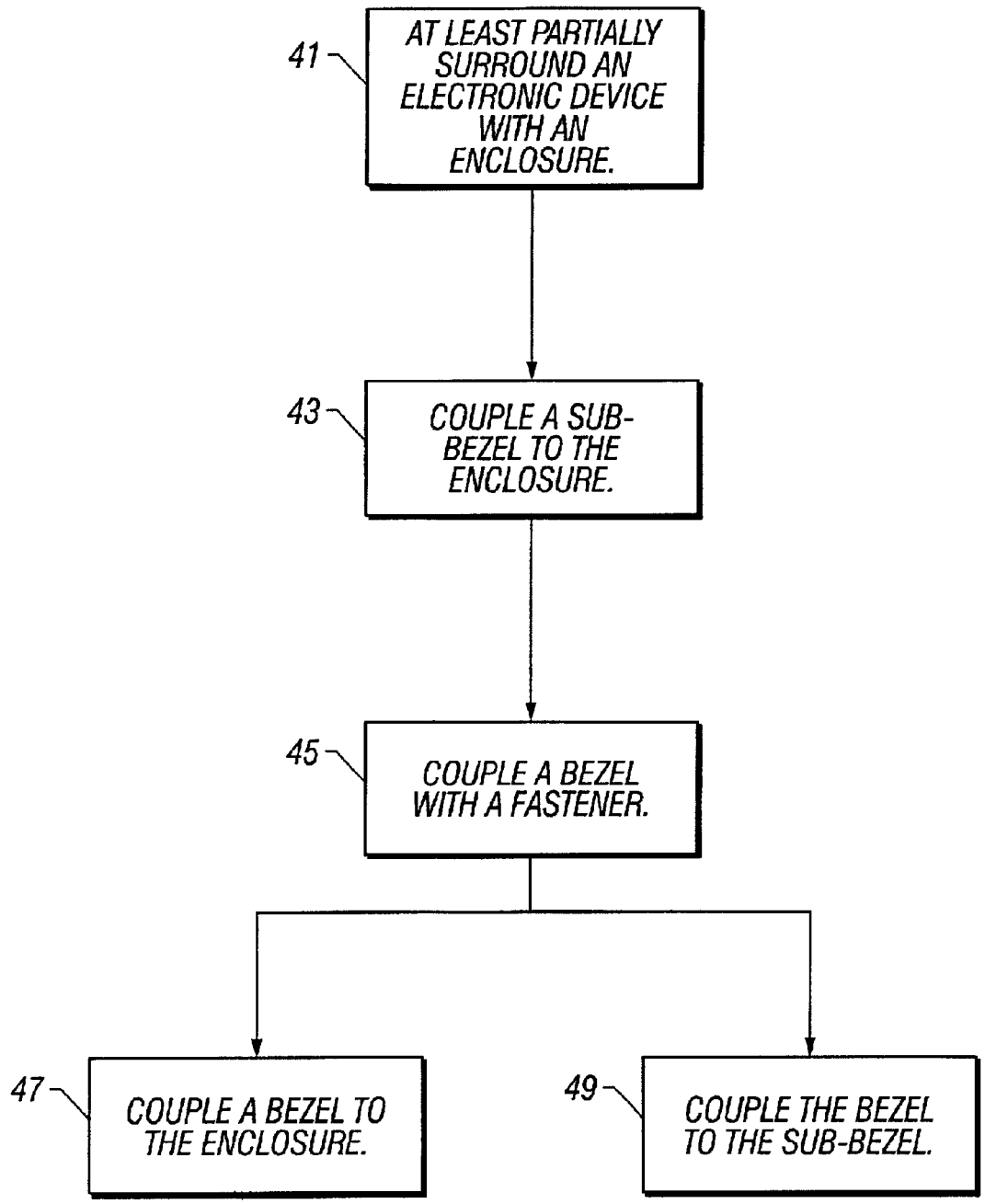
FIG. 5 shows a flowchart for assembly.

Referring to FIG. 5, an embodiment of the invention is shown in the form of a flowchart. At block 41, an electronic device is at least partially surrounded with an enclosure. At block 43, a sub-bezel is coupled to the enclosure. The sub-bezel may shield a substantial portion of electronic emissions from entering or leaving the electronic device. The electronic device may then be ready to pass through emission testing. At block 45, a bezel may be coupled using a fastener. At block 47, the bezel may be coupled to the enclosure, or, at block 49, the bezel may be coupled to the sub-bezel.

Figure 6:
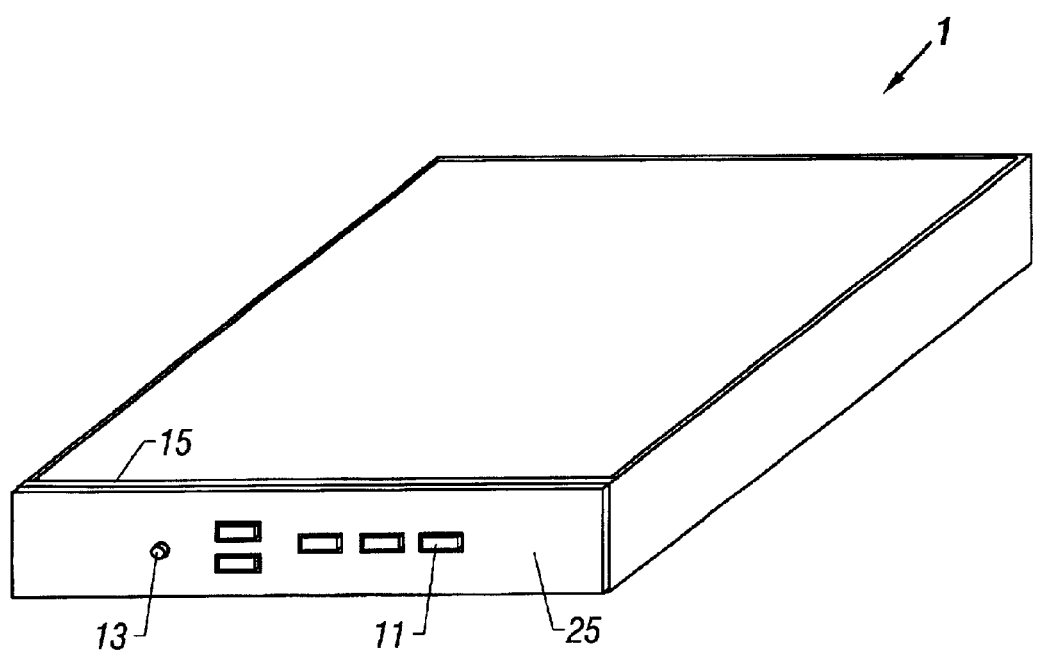
FIG. 6 shows an embodiment without a top panel to show a bezel attached to the front.

As seen in FIG. 6, an embodiment of the invention is shown as an electronic system 1 with a bezel 25 coupled to an electronic device, the sub-bezel 15, or the enclosure surrounding the electronic device. Because the top panel 5, as seen in FIG. 2, has been removed, the sub-bezel 15 can be seen behind bezel 25. The electronic device components 11 and 13 should be accessible through the sub-bezel 15 and bezel 25. Bezel 25 may vary in appearance from customer to customer. However, because the electronic device is already shielded by the enclosure and the sub-bezel 15, the electronic device will not have to be sent back for regulatory testing each time bezel 25 is switched out. In addition, bezel 25 may be added after the regulatory testing making it cheaper for companies to make electronic devices for several different customers and then make the bezels 25 depending on projected customer buys. If a customer projection is too high, such that a specific customer buys fewer electronic devices than expected, the electronic devices made for that customer can be fitted with the bezels 25 for a different customer, such as a customer for which the customer projection was too low. Without the sub-bezel 15, old bezels would have to be removed, a new bezel coupled to the electronic device, and then the electronic device with the new bezel may have to be sent through regulatory testing again. This can make refitting bezels potentially very costly for the companies.

Other devices that give off electronic emissions and may go through regulatory testing can also benefit from having a sub-bezel and interchangeable bezels. These devices include but are not limited to set top boxes. With interchangeable bezels, these devices can be tested with the sub-bezels in place and their bezel can be added later and changed if need be without needing to retest the device.

Although an exemplary embodiment of the invention has been shown and described in the form of interchangeable bezels, many changes, modifications, and substitutions may be made without departing from the spirit and scope of the claimed invention.

We claim:

1. An apparatus comprising:
   an electronic device;
   an enclosure at least partially surrounding said electronic device;
   a sub-bezel coupled to the enclosure of said electronic device to block electronic emissions from the electronic device, the sub-bezel having one or more slots;
   a bezel to be removably coupled to at least one of the enclosure and the sub-bezel with the sub-bezel disposed between the bezel and the enclosure, the bezel including one or more bezel snaps to be inserted through corresponding one or more slots in the sub-bezel when the bezel is attached to the enclosure; and
   wherein the sub-bezel and the bezel each include a hole to allow access to a component of said electronic device.

2. The apparatus of claim 1, wherein said electronic device is a network appliance.

3. The apparatus of claim 1, wherein said enclosure comprises:
   a side panel;
   a bottom panel; and
   a top panel.

4. The apparatus of claim 3, wherein said sub-bezel and said bottom panel are one piece.

5. The apparatus of claim 4, wherein said sub-bezel and said enclosure are one piece.

6. The apparatus of claim 1, wherein said electronic device component is selected from a group consisting of dials, buttons, electronic displays, connectors, and lights.

7. The apparatus of claim 1, wherein said enclosure includes a material selected from a group consisting of steel and aluminum alloys.

8. The apparatus of claim 1, wherein said sub-bezel includes a material selected from a group consisting of steel and aluminum alloys.

9. The apparatus of claim 1, wherein said bezel includes a material selected from a group consisting of plastic, steel, and aluminum alloys.

10. The apparatus of claim 1, wherein said bezel is made of ABS plastic.

11. The apparatus of claim 1, wherein said enclosure has a flange extending over said sub-bezel.

12. The apparatus of claim 11, wherein said flange at least partially fits inside said bezel.

13. The apparatus of claim 12, wherein said flange partially blocks external light from passing into said enclosure.

* * * * *